(12) United States Patent
Jarek et al.

(10) Patent No.: US 6,548,215 B2
(45) Date of Patent: *Apr. 15, 2003

(54) METHOD FOR THE PRODUCTION OF A PRINTING PLATE USING THE DUAL-FEED TECHNOLOGY

(75) Inventors: Mathias Jarek, Northeim (DE); Dietmar Frank, Northeim (DE)

(73) Assignee: Kodak Polychrome Graphics LLC, Norwalk, CT (US)

( * ) Notice: Subject to any disclaimer, the term of this patent is extended or adjusted under 35 U.S.C. 154(b) by 54 days.

This patent is subject to a terminal disclaimer.

(21) Appl. No.: 09/779,811

(22) Filed: Feb. 9, 2001

(65) Prior Publication Data

US 2002/0155369 A1 Oct. 24, 2002

(51) Int. Cl.⁷ .............................. G03G 13/28; G03F 7/26
(52) U.S. Cl. ..................... 430/49; 430/56; 430/300; 430/302; 430/275.1
(58) Field of Search .......................... 430/49, 56, 300, 430/302, 275.1

(56) References Cited

U.S. PATENT DOCUMENTS

| | | | |
|---|---|---|---|
| 3,635,709 A | 1/1972 | Kobayashi | 96/33 |
| 4,102,686 A | 7/1978 | Weinberger et al. | 96/91 |
| 4,350,753 A | 9/1982 | Shelnut et al. | 430/190 |
| 5,616,449 A | 4/1997 | Cheng et al. | 430/302 |
| 5,695,905 A | 12/1997 | Savariar-Hauck et al. | 430/162 |
| 5,731,127 A | 3/1998 | Ishizuka et al. | 430/270 |
| 5,744,272 A | 4/1998 | Elsaesser et al. | 430/96 |
| 6,051,366 A | 4/2000 | Baumann et al. | 430/284 |
| 6,238,831 B1 * | 5/2001 | Hauck et al. | 430/302 |

FOREIGN PATENT DOCUMENTS

| | | |
|---|---|---|
| DE | 4418645 | 12/1995 |
| DE | 19510526 | 9/1996 |
| DE | 19518118 | 11/1996 |
| DE | 019825244 A1 * | 12/1999 |
| EP | 0509523 | 10/1992 |
| EP | 0632328 | 1/1995 |
| EP | 0709399 | 5/1996 |
| EP | 0733955 | 9/1996 |
| EP | 0752430 | 1/1997 |
| EP | 0766140 | 4/1997 |
| WO | 9620429 | 7/1996 |
| WO | 9739894 | 10/1997 |

* cited by examiner

Primary Examiner—Mark A. Chapman
(74) Attorney, Agent, or Firm—Faegre & Benson, LLP (57) ABSTRACT

A method for producing printing plate precursors by dual-feed technology is described. The obtained printing plate precursors contain polymer particles in the photosensitive layer and show high print run stability.

17 Claims, 5 Drawing Sheets

Figure 3 particle size obtained with run 3
(magnification = 2500)

Figure 4 particle size obtained with run 4
(magnification = 2500)

Figure 5 particle size obtained with run 5
(magnification = 2500)

METHOD FOR THE PRODUCTION OF A PRINTING PLATE USING THE DUAL-FEED TECHNOLOGY

FIELD OF THE INVENTION

The invention relates to a process for producing a photosensitive coating; in particular it relates to a process for producing a printing plate comprising such a coating as well as printing plates obtained by the method.

BACKGROUND OF THE INVENTION

In recent times, the requirements with regard to the print run stability of offset printing plates have increased. For the improvement of the mechanical properties of offset plates, basically two methods have been discussed.

One of them relates to the improvement of the properties of the binders or the photosensitive composition (U.S. Pat. No. 4,102,686). This method often entails high costs due to the complexity of the synthesis regarding the preparation of such custom high-performance binders.

The other, less expensive method is the introduction of polymer particles into the photosensitive layer. The mechanical resistance of such particle-containing layers is often superior to that of layers with modified binders. Apart from the increase of the mechanical resistance of the layer, there are further advantages: From the literature it is known that the chemical resistance can be increased while the exhausting times in the copying frame and the adhesiveness can be reduced. So far, various methods have been employed for introducing the polymer particles into the layer.

Commercially available micronized particles which are difficult to dissolve in common organic solvents (for example polyethylene, polytetrafluoroethylene, cross-linked polymethylmethacrylate or polyamide) are dispersed and added to the coating solution. This entails the disadvantage that these polymer particles first have to be dispersed which constitutes an additional process step. In some areas, the particles are often distributed rather inhomogeneously after the coating has been completed. Furthermore, in particles consisting of nonpolar polymers the adhesion to the layer is reduced. The retention time of the coating solution prepared is limited as well since these dispersions tend to form sediments or agglomerates. Furthermore, the particle dispersions cause problems in the filtering of the coating solution since the pore size of the filter cannot be smaller than the particle diameter. Starting solutions which have not been sufficiently filtered often lead to coating defects.

Another method is to prepare dispersions or emulsions of polymers by emulsion/dispersion polymerization, for example in copolymers of acrylates, styrene derivatives and other monomers, or by precipitation reaction of polymers which dissolve in common organic solvents, for example acrylonitrile butadiene styrenes (ABS) which are then added to the coating solution (U.S. Pat. No. 4,233,390, EP-A-0 709 399, U.S. Pat. No. 5,616,449, EP-A-0 632 328, EP-B-0 509 523).

Thus, due to the higher polarity of the polymer particles, an improved adhesion of the particles to the layer is achieved, but the above-mentioned disadvantages such as poor filterability, locally inhomogeneous distribution in the layer, and short stability of the batch remain.

Another process describes, with regard to positive working printing plates, the use of specifically developed polymers which are soluble in alkaline developers and organic media and which form a homogenous solution with the coating composition. By way of complicated drying apparatuses difficult to operate with regard to the process control, a separation of the binders intended for the positive plates and the polymers during drying is achieved (EP-A-0 766 140). This coating solution can be filtered since a "real" solution is present. A disadvantage of this method is that the particles are preferably formed in the upper part of the photosensitive layer, with the lower part of the layer not being protected from mechanical abrasion. Furthermore, both the drying apparatus and the polymers which form the particles, have to be specifically adapted to this purpose of use, which constitutes a high cost factor. A further disadvantage of this method is that the resulting polymer particles, which are soluble in the developer, can partly be extracted from the layer by the developing step and that the remaining cavities rather destabilize the image areas.

In U.S. Pat. No. 6,238,831 based on PCT/DE99/016730 coating solutions are disclosed which comprise:

a) a positive or negative working, or electrophotographically working photosensitive composition, b) a thermoplastic polymer which is soluble in organic media but insoluble in alkaline media, c) a solvent component A which dissolves both the photosensitive composition and the thermoplastic polymer, and optionally d) a solvent component B which dissolves the photosensitive composition but not the thermoplastic polymer and which is less volatile than component A, with a) and b) being homogeneously dissolved in the mixture of c) and d).

The offset printing plates obtained according to this application show high print run stability, are developable by means of conventional developers, exhibit high resolutions, have sufficient resistance to common cleaning chemicals and show fast and good ink resistance. However, there is a need for improving the method for producing such plates as disclosed in U.S. Pat. No. 6,238,831 since the line speed cannot be increased over 20 m/min because the particles need some time to grow.

It is therefore the object of the present invention to provide a method for producing offset printing plates having high print run stability which enables the production of printing plates with particle-containing photosensitive layers at high line speeds, i.e. a line speed over 20 m/min.

SUMMARY OF THE INVENTION

This object is achieved by a method comprising the following steps:

(a) providing a first solution comprising a thermoplastic polymer P and a solvent component A, the thermoplastic polymer being soluble in organic media but insoluble in alkaline media and solvent A being capable of dissolving the thermoplastic polymer and a conventional photosensitive composition (b) separately providing a second solution comprising a solvent component B which is capable of dissolving a conventional photosensitive composition but not the thermoplastic polymer and which is less volatile than solvent A (c) separately feeding the solutions of steps (a) and (b) above to an in-line mixer unit (d) directly transferring the obtained mixture to a coating unit (e) applying the mixture to a printing plate substrate wherein a conventional positive or negative working, or electrophotographically working photosensitive composition C is either present in one of the first and second solution or in both solutions.

DETAILED DESCRIPTION OF THE INVENTION

Figure 1:
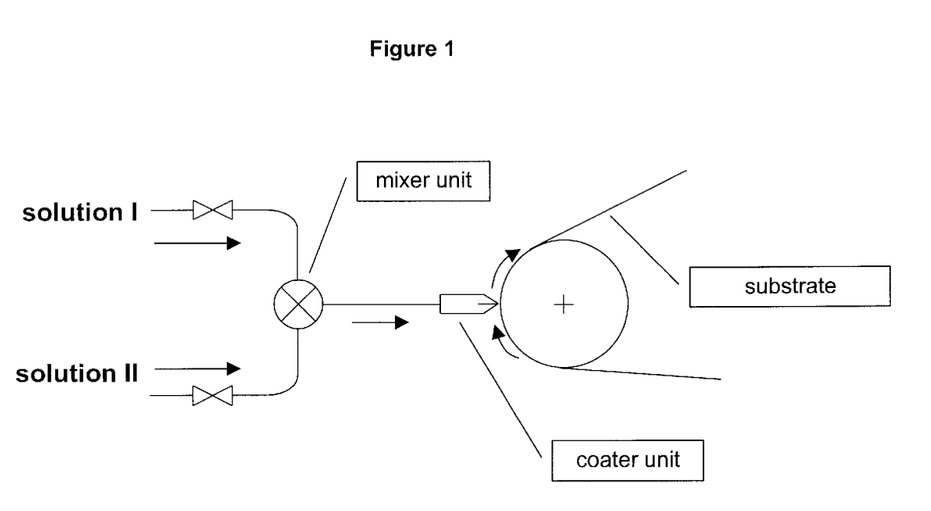
FIG. 1 is a schematic illustration showing the use of the dual-feed technology in accordance with the invention.

The method of the present invention makes use of the dual-feed technology where two different solutions (I and II) are mixed in line before the mixture is directly transferred to a coating unit and applied to the printing plate substrate. The dual-feed technology is schematically shown in FIG. 1.

The first solution (I) comprises a thermoplastic polymer P which is soluble in organic media but insoluble in alkaline media, and a solvent A which is capable of dissolving the thermoplastic polymer and a conventional photosensitive composition.

The second solution (II) comprises a solvent B which is capable of dissolving a conventional photosensitive composition but not the thermoplastic polymer and which is less volatile than solvent A.

It is also possible, that a part of the total amount of solvent B used is present in solution (I), as long as the thermoplastic polymer P does not start to precipitate from the solution (I). Furthermore, it is possible that a part of solvent A is present in solution (II), as long as solution (II) still behaves as a precipitant for the thermoplastic polymer P after mixing with solution (I).

Within this application it is to be understood that solvents A and B respectively are not only single solvents but can also be a mixture of two or more miscible solvents as long as the mixture used for A and the mixture used for B, respectively behaves as defined above concerning dissolution of the thermoplastic polymer and volatility.

Furthermore, a conventional photosensitive composition C is used which is either added completely to one of solutions I and II or is divided between the solutions. If the photosensitive composition is divided between solutions I and II it is preferred that about 99 to about 5 wt%, more preferred about 99 to about 10 wt% of the total amount of the photosensitive composition is present in solution I and the remaining portion is present in solution II.

As photosensitive composition C, any radiation-sensitive composition is suitable which, after exposure to radiation (UV, visible or IR) and optionally developing and/or fixing provides an area in imagewise distribution which can be used for printing; this includes positive or negative working photosensitive systems as well as electrophotographically working systems, which are, for instance, described in U.S. Pat. Nos. 5,731,127, 3,635,709, 4,350,753 (positive working systems), DE-A-19518118, DE-A-4418645, EP-A-752430 (negative working systems), WO-A-97/39894, WO-A-96/20429 (thermally working systems), DE-A-19510526, EP-A-733955 (electrophotographically working systems); the present invention can be applied to this without any restrictions.

The thermoplastic polymer present in solution I is soluble in organic media and insoluble in alkaline media and is preferably commercially available. Polymers exhibiting high abrasion stability and high tenacity values are preferred. Suitable polymers are i.a.: polystyrene (PS), styrene-acrylonitrile-copolymers (SAN), styrene-acrylonitrile-butadiene-terpolymer (ABS), acrylonitrile terpolymer, chlorinated polyethylene and styrene (ACS), acrylate-acrylonitrile-styrene-copolymers (ASA), styrene-butadiene-styrene-block-polymers (thermoplastic elastomer), styrene-isoprene-styrene-blockpolymers (thermoplastic elastomer), styrene-ethylene/butylene-styrene-blockpolymers (thermoplastic elastomer), styrene-ethylene/propylene-styrene-blockpolymers (thermoplastic elastomer), styrene maleic acid anhydride copolymers, polymethylmethacrylate (PMMA), polyalkyl(meth)acrylates, polyaryl(meth)acrylates, polyaralkyl(meth)acrylates, polycarbonates (PC), polysulfones, polyethersulfones, polyesters (soluble types), polyamides (soluble types), polyimides (soluble types), cellulose alkylester, cellulose arylester, cellulose aralkylester, polyacetale, ethylene-alkyl(meth)acrylate copolymers, polybutadiene, polyisoprene, polymethylpentene, polyvinylchloride (PVC), polyvinylcarbazole, polyvinylacetates (PVAc), ethylene-vinylacetate-copolmer (EVA), polyvinylidenechloride (PVDC), polyvinylidenefluoride (PVDF), polyurethanes (soluble types), polyalkylsiloxanes, polyarylsiloxanes, polyaralkylsiloxanes, and further types, as well as blends of the above-mentioned polymers among each other as well as copolymers of the monomers of said polymers. Particularly preferred are PS, SAN, PC, PMMA, ABS and polysulfone.

These polymers are dissolved in solvent component A to form a homogeneous phase.

Solution I used in the method according to the invention further comprises an easily volatile solvent component A, which dissolves both the components of the photosensitive composition as well as the particle-forming thermoplastic polymer P.

As solvent component A, the following substances can be used for example: acetone, butanone-2 (MEK), methylisobutylketone (MIBK), cyclohexanone, tetrahydrofuran (THF), dioxan, dioxolane, isobutylformate, ethylacetate, butylacetate, methyllactate, ethyllactate, ethylether, nitroethane, methylenechloride, dichloroethylene, chloroform, trichloroethane, perchloroethylene, mixtures thereof and other highly volatile solvents common in the coating technology.

Solution II used in the method according to the present invention comprises a solvent component B which is capable of dissolving the conventional photosensitive composition but not the thermoplastic polymer. In addition solvent B should be less volatile than solvent A.

As component B, the following substances can be used for example: methanol, ethanol, butanol, ethyleneglycol, methyldiglycol, ethylglycol (EC), methylglycol (MC), dimethylformamide, dimethylacetamide, N-methylpyrrolidone, dimethylsulfoxide (DMSO), methyllactate, ethyllactate, γ-butyrolactone, mixtures thereof and other solvents common in coating technology wherein the polymer is poorly soluble.

Optionally, solutions I and II used in the method according to the invention can also contain a surfactant in order to support the particle formation and to prevent a potential agglomeration of the particles. As surfactants, a broad spectrum of non-ionic or ionic compounds can be used, for example alkoxylated fatty alcohols (Brij 78™), alkoxylated silicones (for example Edaplan™), fluorinated surfactants (for example FC 470™) and further substances that are compatible with the respective solvent system. The surfactant can be present in either one of solutions I and II or in both of them.

Figure 2:
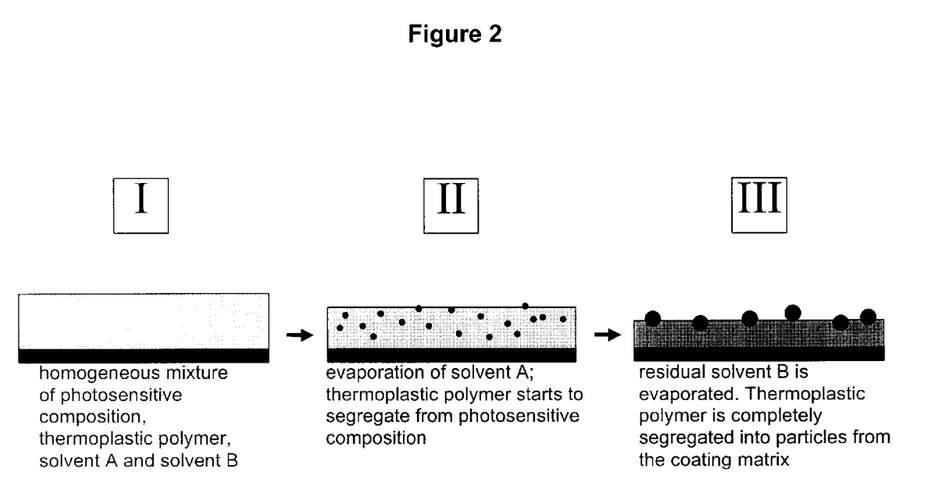
FIG. 2 is a schematic illustration of the mechanism of particle formation in accordance with the invention.

The mechanism of the particle formation is shown in FIG. 2. At the starting point (I) of the illustration, both the thermoplastic polymer P and the photosensitive composition C are homogeneously dissolved in the solvent mixture of A and B. In time, more and more of the highly volatile solvent component A evaporates so that the thermoplastic polymer P starts to segregate. In this phase (II), which is still sufficiently mobile, the polymer P starts to form small particles due to the incompatibility with solvent B. The particles continue to grow by coalescence until the system has lost so much mobility by the continuous evaporation of the solvent B that no coalescence can occur anymore. The system now consists of two phases (III): a matrix rich in C and particles rich in P.

According to the method of the present invention solutions I and II are prepared separately and are separately fed to the mixer unit. As the mixer every mixer conventionally used for mixing liquids can be used. Examples are for instance static or dynamic mixers. It is important, that the dwell time after mixing is short, otherwise precipitation can occur in the pipelines.

The amounts of the thermoplastic polymer P, the photosensitive composition C and solvents A and B can be controlled by the amounts present in solutions I and II as well as the rates used for introducing solutions I and II into the mixing unit. The weight ratio of solvent A to solvent B in the mixture obtained in the mixing unit varies within a wide range depending on the combination of A, B and P, in many cases it can range from 99:1 to 10:90. The thermoplastic polymer P is preferably present in an amount of about 1 to about 50 wt% based on the solids in the solution.

The higher amount of solvent B results in an accelerated growing of the polymer particles which in turn results in the possibility of production with a higher line speed. This is the core concept of this invention: The dual feed method allows a much higher concentration of solvent B in the coating composition (after the mixing unit) than the classical "one-pot" method does. For dual-feed, the upper concentration limit of B is reached, when the precipitation speed of polymer P becomes faster than the dwell time after mixing in the pipelines (mostly some seconds up to one minute). The one-pot method requires a minimum batch stability of 24 h, so that the concentration of B has to be chosen significantly lower than for dual-feed.

Coatings obtained by the dual-feed method do not differ from coatings obtained with the same weight ration of A:B by a one-pot method.

The mixture obtained in the in-line mixing unit is directly transferred to the coater. Every coater usually used for applying a liquid coating composition to a substrate can be used as long as the solution has a short dwell time in the pipes and is not recycled. Examples are for instance roll coaters, slot coaters and various other types. In a preferred embodiment of the method according to the present invention a slot coater is used. The coating composition is applied such that the dry weight thickness of the coating is preferably about 0.25 to about 10 $g/m^2$, more preferably about 0.5 to about 5 $g/m^2$.

Any dimensionally stable substrate commonly used for the preparation of offset printing plates can be coated by the method according to the present invention. Preferably the substrate is selected from the group consisting of mechanically and/or electrochemically grained aluminum web or plate, grained aluminum which was subjected to an anodizing treatment and plastic foils which may optionally be laminated to an aluminum foil. The grained and optionally anodized aluminum substrate may be further subjected to a hydrophilizing treatment before applying the photosensitive coating composition by the method according to the invention.

The line speed obtained by the method according to the invention is preferably 1.5 to 3 times as high as the line speed obtained with the same equipment with the "one-pot" method.

After coating the substrate with the mixture obtained in the mixer unit the coated substrate is optionally transferred to a drying unit. The air temperature used in the drying unit is not limited but preferably it is in the range of about 50 to about 200° C.

Several factors influence the parameter which ultimately is most important in the particle formation process, i.e. the particle size.

(a) On the one hand, the process is time-dependent since the particles grow by coalescence; the faster the drying process the sooner the growth process is stopped and the smaller are the particles obtained. Thus, the time until the end of the growth step can be influenced by the performance of the drier. In commercial driers, however, the respective range is limited and furthermore requires longer retrofitting and waiting times only upon a temperature change.

(b) On the other hand, the particle size can be varied by the total solids concentration. The higher the solids concentration, the smaller are the particles that form since this corresponds to a pre-dried system. However, the variation is only slight since considerable changes in the viscosity changes of the coating solution occur and the "viscosity window" of most coaters does not leave too much latitude; in most coater systems, the latitude is at a maximum of ±25% in the solids content of a special coating solution. Depending on the coating system, the solids concentration (in % by weight, based on the coating solution) of the coating solutions obtained in the mixing unit according to the method of the invention, is 0.5–50%, preferably 1–30%.

The solvent ratio A/B turned out to be a particularly fast and easily modifiable parameter. Of all parameters, it has the greatest influence on the particle size. By modifying the solvent components and the solvent ratio, the particle size can be controlled within a broad range (for example from about 0.1 to about 10 $\mu$m.). The more low-volatility component B is used with all other parameters being constant, the larger the particles get. The mechanical resistance increases as the particle size grows. From a certain limiting value of B in the mixture obtained in the mixing unit, an optimum is achieved and the mechanical stability is not further improved even upon adding more B—which corresponds to a further enlargement of the particle size.

The average particle sizes in the coatings of the printing plate precursors obtained by the method of according to the invention are within the range of about 0.1 to about 10 $\mu$m, preferably about 0.5 to about 8 $\mu$m. A value which is about as high as the layer thickness has turned out as optimum.

If the particles are smaller than the layer thickness, they may sink further down in the layer during the drying process, so that the upper part of the layer would not protected against abrasion. Particles which are considerably higher than the layer thickness, i.e. the particles "growing out" of the layer, have not been observed yet; instead, the particles take on an elliptic shape.

The number of particles and thus also the mechanical stability increases as the amount of the thermoplastic polymer in the mixture obtained in the mixing unit of the method according to the invention.

The thus prepared particle-containing printing plates all have a better print run stability than common printing plates. Particularly in positive working printing plates, the number of copies is considerably higher both in baked and non-baked printing plates than in comparable plates which do not contain polymer particles according to the present invention.

In parameters relating to the copying technique such as resolution and photosensitivity, no measurable or relevant deterioration was observed with regard to the printing plates according to the invention in comparison with plates of the same composition—except the polymer which forms the particles. This also applies to the developability and the correctability of these printing plates.

The method according to the invention is advantageous in that printing plates having a high print run stability can be produced with a much higher production speed than it could be done with the one pot method described in PCT/DE99/016730.

The following examples describe the invention in more details without limiting it.

EXAMPLE

In Table 1 the standard "master" batch used for all following examples is shown. This masterbatch solution is used as material stream I (see table 2 and FIG. 1).

TABLE 1

| Components of the masterbatch | wt-% (solids) | weight [kg] |
|---|---|---|
| low molecular novolak esterified with 1,2-napthoquinonediazid-4-sulfonic acid | 25 | 5.00 |
| Cresol/formaldehyde novolak resin (meta: para = 75/25), Mw = 7000 | 63.45 | 12.69 |

TABLE 1-continued

| Components of the masterbatch | wt-% (solids) | weight [kg] |
|---|---|---|
| 2,4-Trichloromethyl-6[1(4-methoxy)-napthyl)]1,3,5-triazine | 0.5 | 0.10 |
| Ethylviolet | 1.0 | 0.20 |
| FC 431 (Fa. 3M) non ionogene fluoraliphatic polymer Ester | 0.05 | 0.01 |
| Polymer [P] | 10 | 2.00 |
| Solvent [A] | — | 80.00 |

In Table 2 four different solvent compositions are shown. These different compositions were obtained by changing the solvent composition of material stream II. System (a) can be used for dual-feed technology as well as for the one-pot method. Systems (b), (c) and (d) mostly have a short batch stability (8–24 h), so they can only be used with the dual-feed technology.

TABLE 2

| no. | overall solvent-composition [wt-%] | composition of material in [wt-%/time] masterbatch from Table 1 | composition of material in stream II [wt-%/time] | |
|---|---|---|---|---|
| | | | share of solvent [B] | share of solvent [A] |
| a | 85 [A]/15 [B] | 50 | 13.5 | 36.5 |
| b | 78.4 [A]/21.6 [B] | 50 | 19.8 | 30.2 |
| c | 73.5 [A]/26.5 [B] | 50 | 24.3 | 25.7 |
| d | 60[A]/40[B] | 50 | 40 | 10 |

Stream I carries all the solids and contains only solvent A; stream II is a solvent mixture A+B with no solids. Solvent B is an organic solvent or a mixture of an organic solvent and water as shown in Table 3 below.

Table 3 describes the polymer P and solvents A and B used in the coating formulation.

TABLE 3

| Run No. | polymer | solvent [A] | solvent [B] | solvent-composition [A]/[B] wt % |
|---|---|---|---|---|
| 1 | acrylonitrile-styrene-butadiene copolymer (Lustran 452, Monsanto) | MEK | MC | 85/15 |
| 2* | acrylonitrile-styrene-butadiene copolymer (Lustran 452, Monsanto) | MEK | MC | 60/40 |
| 3 | polysulfon (Udel P1800, Amoco) | dioxan | PM | 85/15 |
| 4* | polysulfon (Udel P1800, Amoco) | dioxan | PM | 80/20 |
| 5* | polysulfon (Udel P1800, Amoco) | dioxan | PM + $H_2O$ | 73.5/26.5 |
| 6 | styrene-acrylonitrile-copolymer (SAN 32, Bayer) | MEK | MC | 85/15 |
| 7* | styrene-acrylonitrile-copolymer (SAN 32, Bayer) | MEK | MC + $H_2O$ | 73.5/26.5 |
| 8 | polycarbonate (Makrolon, Bayer) | THF | PM | 85/15 |
| 9* | polycarbonate (Makrolon, Bayer) | THF | PM + $H_2O$ | 78.4/21.6 |
| 10 | styrene-butadiene-blockpolymer (Styroflex ™, BASF) | MEK | MC | 85/15 |

TABLE 3-continued

| Run No. | polymer | solvent [A] | solvent [B] | solvent-composition [A]/[B] wt % |
|---|---|---|---|---|
| 11* | styrene-butadiene-blockpolymer (Styroflex ™, BASF) | MEK | MC + $H_2O$ | 73.5/26.5 |
| 12 | acrylonitrile-styrene-acryl copolymer (ASA, BASF) | MEK | MC | 85/15 |
| 13* | acrylonitrile-styrene-acryl copolymer (ASA, BASF) | MEK | MC | 60/40 |
| 14 | polystyrene (PS 168N, BASF) | ethyl acetate | EC | 85/15 |
| 15* | polystyrene (PS 168N, BASF) | ethyl acetate | EC + $H_2O$ | 73.5/26.5 |

*Coating solution is not stable for more than 8–24 h.
EC: ethylglycol
MC: methylglycol
PM: 1-methoxypropanol-2
MEK: methyl ethyl ketone (butanone-2)
THF: tetrahydrofuran A commonly used aluminum support was coated by means of a model apparatus similar to that shown in FIG. 1 and compositions I and II shown above. Plates were fast-dried with a fan to simulate an intensive dryer e.g. high line speed.

Investigation: Reflection, Abrasion and SEM

The plate samples were investigated with a reflectometer; the reflection (glossyness) of the plate surface is an indirect value for the particle size: the lower this value, the bigger the particles. Abrasion measurement is done with a sponge, filled with a grinding liquid which oscillates over the plate for 15 min. The abrasion-loss corresponds with the particle size the lower the loss, the bigger the particles.

TABLE 4

Figure 3:
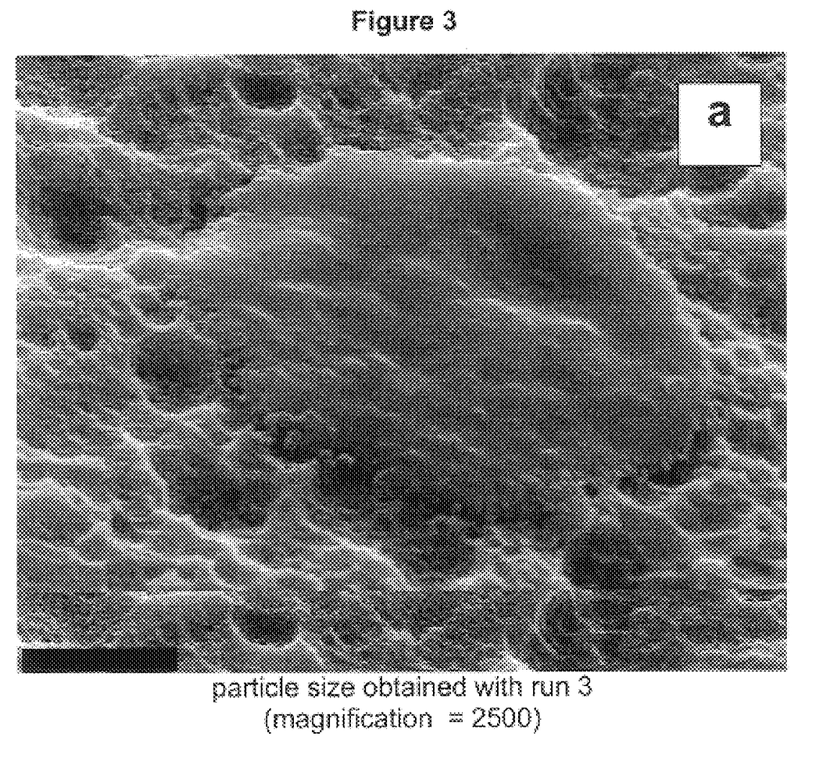
FIG. 3 is a scanning electron micrograph of a printing plate prepared by dual feed technology in accordance with Run 3.
Figure 4:
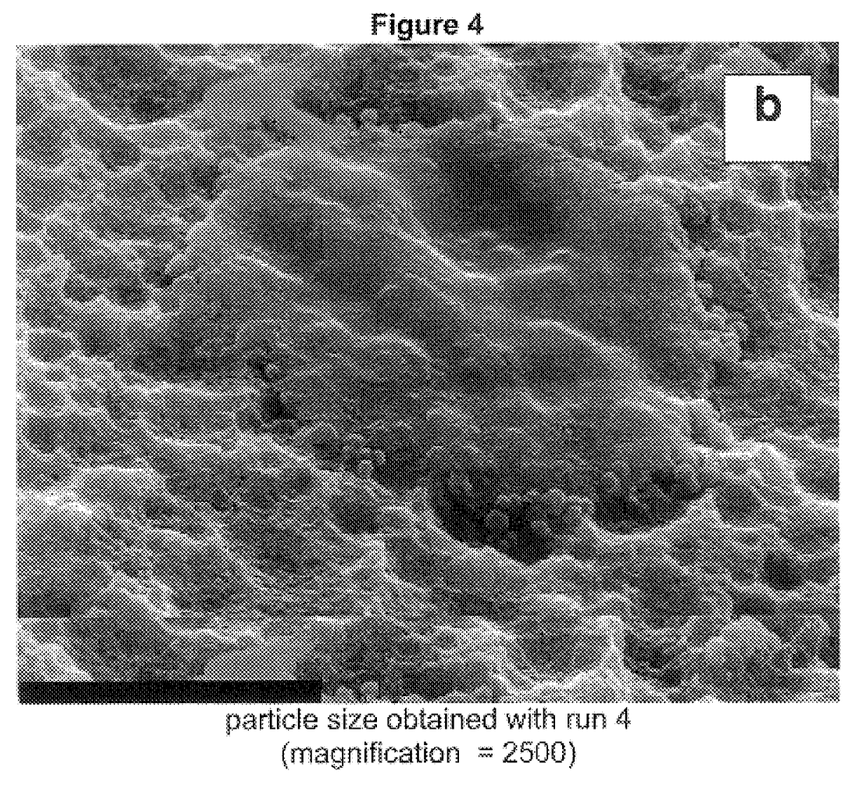
FIG. 4 is a scanning electron micrograph of a printing plate prepared by dual feed technology in accordance with Run 4.
Figure 5:
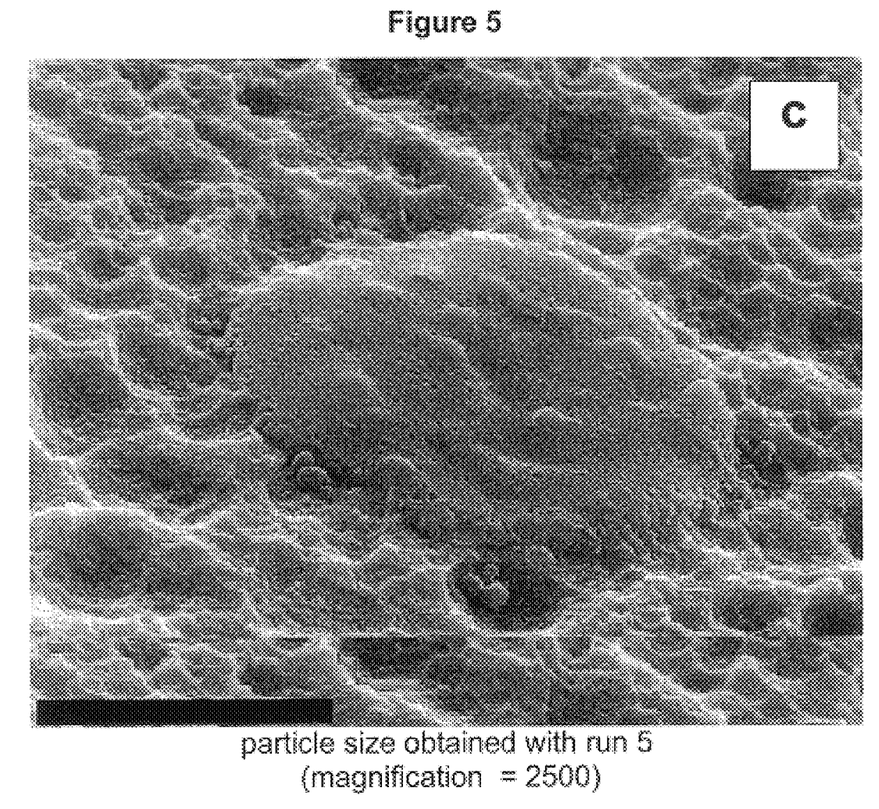
FIG. 5 is a scanning electron micrograph of a printing plate prepared by dual feed technology according to Run 5

| sample | reflection-value | abrasion-loss [g/m$^2$] | estimated particle size [μm] | SEM micrograph |
|---|---|---|---|---|
| plate without particles | 88 | 1.13 | — | — |
| plate obtained by run 3 | 55 | 0.35 | <1 μm | FIG. 3 |
| plate obtained by run 4 | 45 | 0.11 | 1–2 μm | FIG. 4 |
| plate obtained by run 5 | 48 | 0.07 | 3 μm | FIG. 5 |

SEM allows a direct view on the particles and gives more detailed information about size and distribution of the particles. In the SEM micrographs in FIGS. 3 to 5 the trend to bigger particles with increasing solvent [B] becomes obvious. The micrographs show very clearly that the dual-feed method can increase the average diameter of the particles significantly. The bigger particles in FIGS. 4 and 5 can only be obtained by application of the dual-feed method, because the coating solution would not be stable anymore as a single batch for more than a few hours. The smaller particles in FIG. 3 can be obtained by one-pot method as well as dual-feed method.

We claim:

1. Method for producing a printing plate precursor comprising:
   (a) providing a first solution comprising a thermoplastic polymer and a solvent or solvent mixture A, solvent A being capable of dissolving the thermoplastic polymer, the thermoplastic polymer being soluble in organic media but insoluble in alkaline media, and a conventional photosensitive composition;
   (b) separately providing a second solution comprising a solvent B which is capable of dissolving a photosensitive composition but not the thermoplastic polymer and which is less volatile than solvent A;
   (c) separately feeding the solutions of steps (a) and (b) above to an in-line mixer unit; and
   (d) applying mixture from the mixer unit to a printing plate substrate thereby forming a coating on the substrate,
   wherein a conventional positive or negative working, or electrophotographically working photosensitive composition C is present in at least one selected from the first solution and the second solution.

2. The method according to claim 1 wherein the photosensitive composition C is present in the first solution.

3. The method according to claim 1 wherein the photosensitive composition C is present in the second solution.

4. The method according to claim 1 wherein the total amount of the photosensitive composition C is present in both the first and second solution.

5. The method according to claim 4 wherein about 5 to about 99 wt% of the photosensitive composition C is present in the first solution and the remaining portion is present in the second solution.

6. The method according to claim 1 wherein the thermoplastic polymer is at least one selected from the group consisting of polystyrene, styrene acrylonitrile copolymer, polycarbonate, polymethylmethacrylate, polyvinylchloride, polymethylpentene, acrylonitrile-butadiene-styrene terpolymer and polysulfone.

7. The method according to claim 1 wherein at least one of the group consisting of the first solution and second solution further contains a surfactant.

8. The method according to claim 1 comprising applying mixture using a slot coater.

9. The method according to claim 1 wherein the weight ratio of solvent A to solvent B is about 99:1 to about 10:90.

10. The method according to claim 9 further comprising producing a printing plate precursor at a line speed of about 5 to about 100 m/min.

11. The method according to claim 1 wherein the substrate is selected from the group consisting of mechanically and/or electrochemically grained aluminum, grained aluminum subjected to an anodizing treatment, plastic foils which may optionally be laminated to an aluminum foil, and a grained and optionally anodized aluminum substrate which is further subjected to a hydrophilizing treatment.

12. Printing plate precursor obtainable by the method of claim 11.

13. The method according to claim 1 further comprising transferring the coated printing plate substrate to a drying unit.

14. The method according to any one of claim 1 or claim 13 further comprising subjecting the coated printing plate substrate to a baking treatment.

15. Printing plate precursor obtainable by the method of claim 1.

16. The printing plate precursor according to claim 15 wherein the coating has a dry weight of about 0.25 to about 10 g/m$^2$.

17. The printing plate precursor according to claim 15 wherein the coating comprises particles of the thermoplastic polymer having a size of about 0.1 to about 10 μm.

* * * * *